(12) United States Patent
Kawase et al.

(10) Patent No.: US 7,402,444 B2
(45) Date of Patent: Jul. 22, 2008

(54) METHOD AND APPARATUS FOR MANUFACTURING A SEMICONDUCTOR DEVICE

(75) Inventors: Yoshimasa Kawase, Kanagawa-ken (JP); Hiroshi Itokawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 132 days.

(21) Appl. No.: 11/519,813

(22) Filed: Sep. 13, 2006

(65) Prior Publication Data

US 2007/0075272 A1   Apr. 5, 2007

(30) Foreign Application Priority Data

Sep. 13, 2005   (JP)   ............... 2005-265849

(51) Int. Cl.
*H01L 21/66* (2006.01)
*G01R 31/26* (2006.01)

(52) U.S. Cl. ................. 438/14; 29/25.01; 257/E21.529; 257/E21.521

(58) Field of Classification Search ............ 438/14, 438/FOR. 101, FOR. 142; 29/25.01; 257/E21.529, 257/E21.521

See application file for complete search history.

(56) References Cited

U.S. PATENT DOCUMENTS

| 6,780,657 B2 * | 8/2004 | Ino et al. ............ 438/14 |
| 2005/0112788 A1 * | 5/2005 | Borden et al. ........ 438/14 |
| 2006/0100735 A1 * | 5/2006 | Hauf et al. .......... 700/121 |

FOREIGN PATENT DOCUMENTS

JP   2001-274109   10/2001

* cited by examiner

*Primary Examiner*—Michelle Estrada
(74) *Attorney, Agent, or Firm*—Finnegan, Henderson, Farabow, Garrett & Dunner, L.L.P.

(57) ABSTRACT

A method of manufacturing a semiconductor device using a wafer emissivity calculated from a wafer reflectivity to calculate a wafer temperature and to calculate target values for heat source optical intensities provided to a plurality of heat sources which heat the wafer and a substrate peripheral structure.

20 Claims, 17 Drawing Sheets

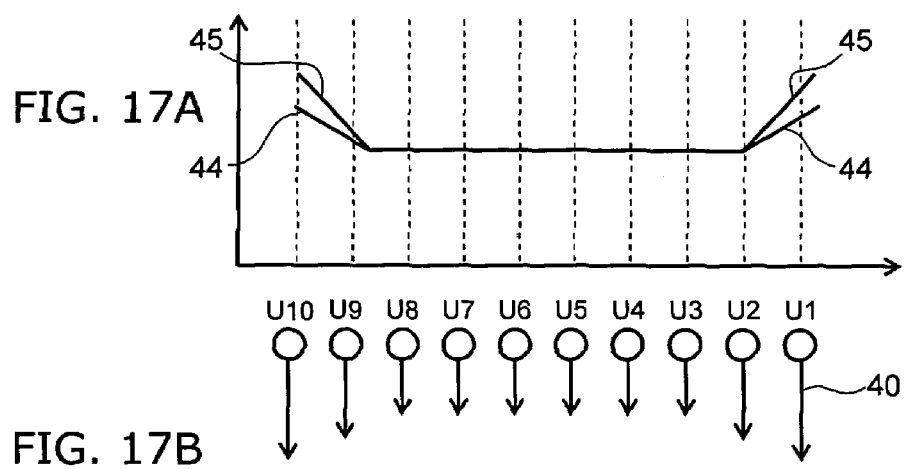
FIG. 17A
FIG. 17B
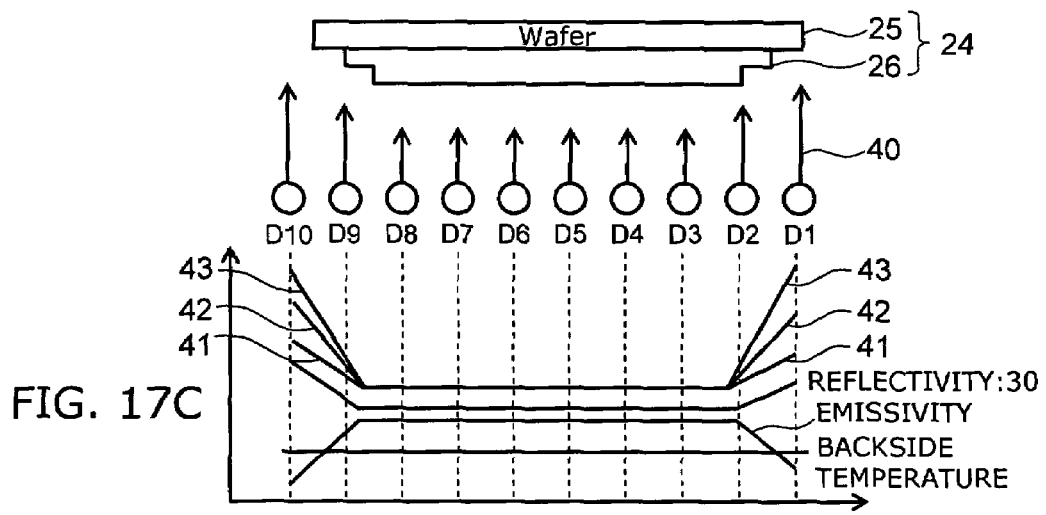
FIG. 17C

METHOD AND APPARATUS FOR MANUFACTURING A SEMICONDUCTOR DEVICE

CROSS-REFERENCE TO RELATED APPLICATIONS

This application is based upon and claims the benefit of priority from the prior Japanese Patent Application No. 2005-265849, filed on Sep. 13, 2005; the entire contents of which are incorporated herein by reference

BACKGROUND OF THE INVENTION

1. Field of the Invention

This invention relates to a method and apparatus for manufacturing a semiconductor device by using lamps to heat a wafer having semiconductor devices thereon.

2. Background Art

In an apparatus for manufacturing a semiconductor device by using lamps to heat a wafer having semiconductor devices thereon, the lamps are placed at the backside of the wafer where the semiconductor devices are not located. At the frontside of the wafer, radiation thermometers are placed for measuring radiation emitted from the wafer (see, e.g., JP2001-274109A). The radiation intensity of radiation emitted from the wafer is measured by the radiation thermometers, and the temperature of the wafer is determined from the radiation intensity. Electric power supplied to the lamps is adjusted on the basis of this wafer temperature.

However, despite using radiation thermometers, the emissivity may be nonuniform within the wafer, or within the region including the wafer where the heating temperature should be uniform. In these cases, the temperature within the wafer becomes nonuniform, and the resulting semiconductor devices may have nonuniform characteristics within the wafer, thereby becoming a cause of decreased semiconductor device yields.

SUMMARY OF THE INVENTION

According to an aspect of the invention, there is provided a method of manufacturing a semiconductor device by processing a wafer, comprising: measuring a reflectivity of a substrate peripheral structure before heating, the substrate peripheral structure being placed close to the wafer and being heated simultaneously with the wafer by a plurality of heat sources; measuring a wafer reflectivity of the wafer before the heating; calculating a wafer emissivity of the wafer from the wafer reflectivity; measuring a wafer radiation intensity of radiation emitted from the wafer during the heating; calculating a wafer temperature of the wafer from the wafer emissivity and the wafer radiation intensity; calculating a target value of on-wafer optical intensity on the wafer so that the wafer temperature becomes a preset temperature; calculating a target value of optical intensity on the substrate peripheral structure from a difference between the reflectivity of the substrate peripheral structure and the wafer reflectivity so that incident light being incident on the substrate peripheral structure and wafer incident light being incident on the wafer have an equal optical intensity; calculating target values of heat source optical intensity for heating by the heat sources so that the target value of on-wafer optical intensity and the target value of optical intensity of the substrate peripheral structure are achieved; calculating target values of heat source power so that the target values of heat source optical intensity are achieved; and inputting the target values of heat source power to the plurality of heat sources and causing the heat sources to emit light.

According to other aspect of the invention, there is provided a method of manufacturing a semiconductor device by processing a wafer, the wafer being simultaneously heated by a plurality of upside heat sources placed at a frontside of the wafer and by a plurality of downside heat sources placed at a backside of the wafer, the method comprising: measuring a central reflectivity of a central portion of the backside of the wafer and a reflectivity of an outer peripheral portion of the backside before the heating; calculating a central emissivity of the wafer from the central reflectivity; measuring a central radiation intensity of radiation emitted from the central portion during the heating; calculating a central temperature of the central portion from the central emissivity and the central radiation intensity; calculating a target value of central optical intensity on the central portion so that the central temperature becomes a preset temperature; calculating a target value of optical intensity on the outer peripheral portion from a difference between the reflectivity of the outer peripheral portion and the central reflectivity so that incident light being incident on the outer peripheral portion and central incident light being incident on the central portion have an equal optical intensity; calculating a plurality of target values of downside heat source optical intensity for heating by the plurality of downside heat sources, respectively, so that the target value of central optical intensity and the target value of outer peripheral optical intensity are achieved; calculating a plurality of target values of upside heat source optical intensity for heating by the plurality of upside heat sources, respectively, so that the plurality of target values of downside heat source optical intensity have a smaller difference; calculating target values of downside heat source power so that the target values of downside heat source optical intensity are achieved; calculating target values of upside heat source power so that the target values of upside heat source optical intensity are achieved; inputting the target values of downside heat source power to the plurality of downside heat sources and causing the downside heat sources to emit light; and inputting the target values of upside heat source power to the plurality of upside heat sources and causing the upside heat sources to emit light.

According to other aspect of the invention, there is provided an apparatus for manufacturing a semiconductor device comprising: a plurality of heat sources which emit light with an inputted heat source power and heating a uniform heating temperature region including a wafer; an input unit which inputs reflectivity at a plurality of positions in the uniform heating temperature region, the reflectivity being measured before the heating; an emissivity calculation unit which calculates emissivity of the uniform heating temperature region from the reflectivity; an optical intensity measuring unit which measures radiation intensity of radiation emitted from the uniform heating temperature region during the heating; a temperature calculation unit which calculates a heating temperature of the uniform heating temperature region from the emissivity and the radiation intensity; an optical intensity calculation unit which calculates a target value of on-region optical intensity on the uniform heating temperature region so that the heating temperature becomes a preset temperature; a correction unit which corrects the target value of on-region optical intensity using a difference in reflectivity among the plurality of positions so that incident light being incident on the uniform heating temperature region has a uniform optical intensity; an optical intensity calculation unit which calculates a target value of optical intensity for heating by the plurality of heat sources so that the target value of on-region optical intensity is achieved; a power calculation unit which calculates a target value of heat source power so that the target value of heat source optical intensity is achieved; and a power supply unit which supplies heat source power at the target value of heat source power to the lamps.

BRIEF DESCRIPTION OF THE DRAWINGS

FIG. 17 shows a lamp power profile of the upside halogen lamps (FIG. 17A), an intensity distribution diagram for radiation from the upside and downside halogen lamps (FIG. 17B), and a backside temperature profile, an emissivity profile, a reflectivity profile, and a lamp power profile of the downside halogen lamps (FIG. 17C), for the semiconductor device manufacturing apparatus according to one embodiment of the invention.

DETAILED DESCRIPTION OF THE INVENTION

Figure 1:
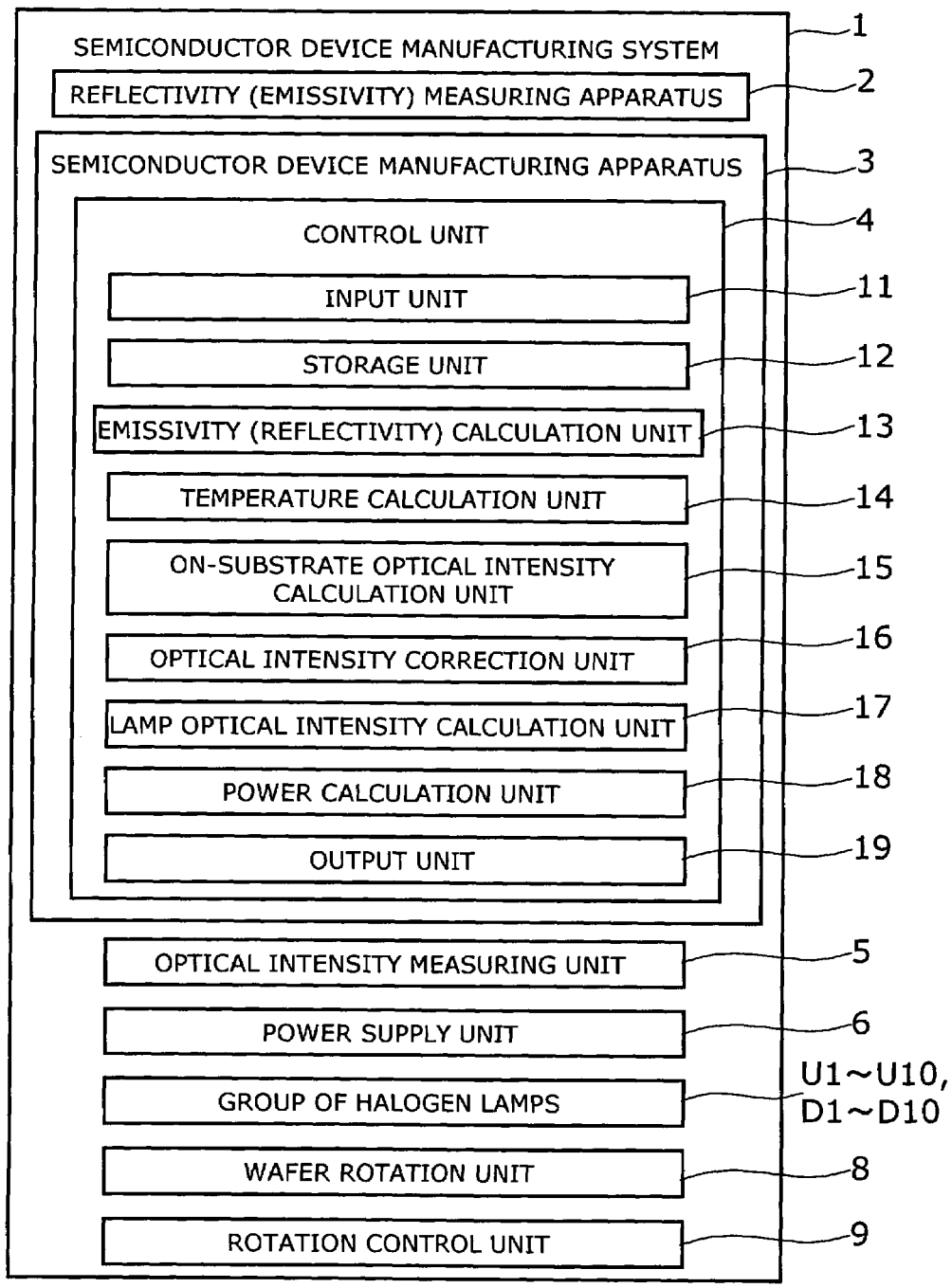
FIG. 1 is a configuration diagram of a semiconductor device manufacturing system according to one embodiment of the invention.

Embodiments of the invention will now be described with reference to the drawings, which are intended for illustration purposes only and not to be construed as limiting the scope of the invention. In the description of the figures, like or similar elements are marked with like or similar reference numerals. It should be noted that the figures are schematic. The relation of the thickness to the planar dimension and the ratio of thickness between various layers may be different from reality.

FIRST EXAMPLE

As shown in FIG. 1, a semiconductor device manufacturing system 1 according to the first example includes a reflectivity (emissivity) measuring apparatus 2 and a semiconductor device manufacturing apparatus 3. The semiconductor device manufacturing apparatus 3 includes a control unit 4, an optical intensity measuring unit 5, a power supply unit 6, a group of halogen lamps U1 to U10, D1 to D10, a wafer rotation unit 8, and a rotation control unit 9. The control unit 4 includes an input unit 11, a storage unit 12, an emissivity (reflectivity) calculation unit 13, a temperature calculation unit 14, an on-substrate optical intensity calculation unit 15, an optical intensity correction unit 16, a lamp optical intensity calculation unit 17, a power calculation unit 18, and an output unit 19.

Figure 2:
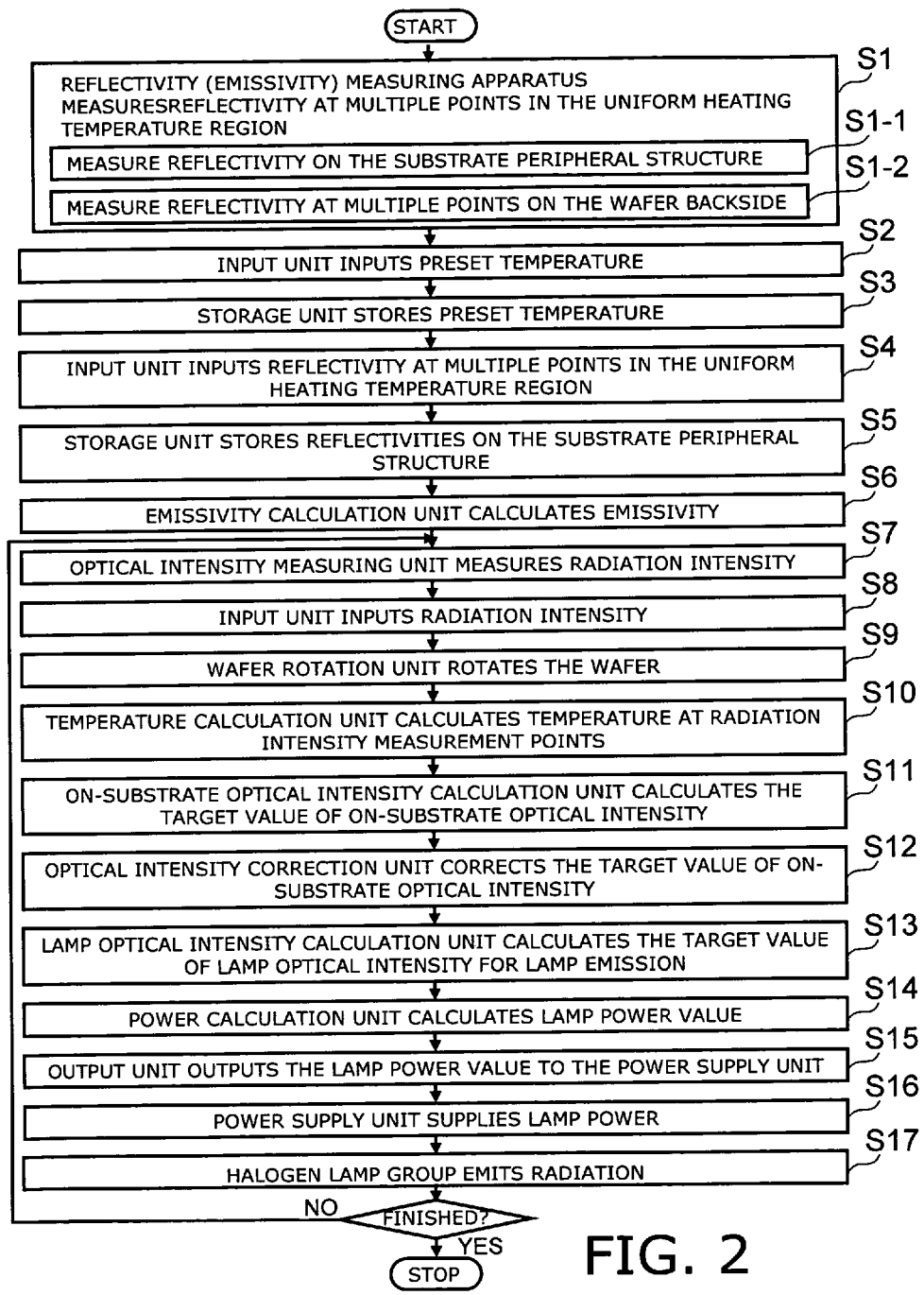
FIG. 2 is a flow chart of a method of manufacturing a semiconductor device according to one embodiment of the invention.
Figure 3A:
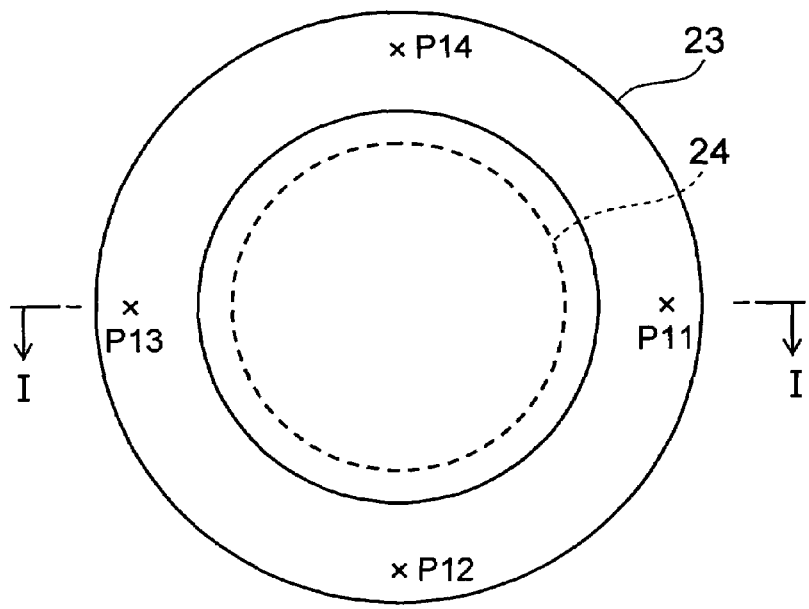
FIG. 3 shows a bottom view (FIG. 3A) and a cross-sectional view (FIG. 3B) of a first set of measurement points for measuring the reflectivity of the substrate peripheral structure.
Figure 3B:
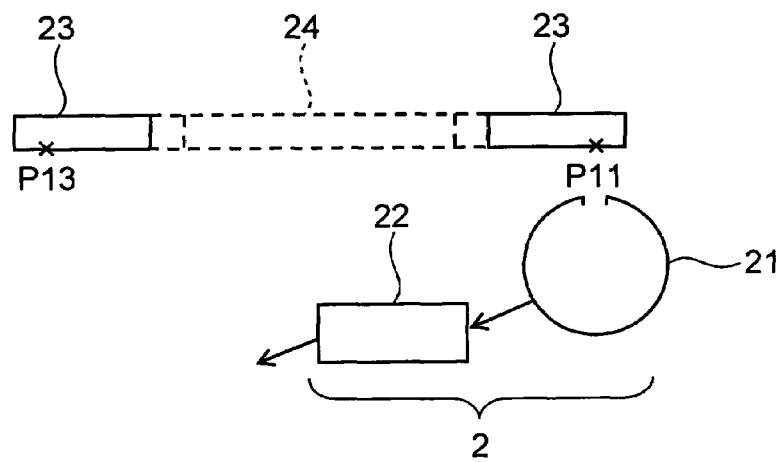

A method of manufacturing a semiconductor device according to the first example is carried out using the semiconductor device manufacturing system 1 of FIG. 1. As shown in FIG. 2, the method of manufacturing a semiconductor device according to the first example begins in step S1, where the reflectivity (emissivity) measuring apparatus 2 measures reflectivity at multiple points in the uniform heating temperature region including the wafer backside. This reflectivity measurement is carried out before the heat treatment of the wafer. The reflectivity measurement is performed in two steps. In the first step S1-1, as shown in FIGS. 3A and 3B, the reflectivity (emissivity) measuring apparatus 2 measures reflectivity at a plurality of measurement points P11 to P14 on the backside of the substrate peripheral structure 23. The reflectivity at measurement points P11 to P14 can be measured before the heat treatment of the wafer if there is no temporal variation. For example, the measurement can be made before introducing the substrate peripheral structure 23 into the heat treatment chamber. The reflectivity (emissivity) measuring apparatus 2 includes an integral sphere 21 and a controller 22 for the integral sphere 21. The reflectivity (emissivity) measuring apparatus 2 uses the integral sphere 21 to measure reflectivity at a plurality of measurement points P11 to P14.

The substrate peripheral structure 23 is warmed to the same temperature as the wafer during heat treatment so that the temperature of the wafer during heat treatment is made uniform within the wafer. The wafer in combination with the substrate peripheral structure 23 warmed to the same temperature as the wafer is referred to as a uniform heating temperature region. As shown in FIGS. 3A and 3B, for the purpose of preventing the temperature on the outer periphery of the wafer 24 from decreasing during heat treatment, a substrate peripheral structure 23 of a ring-shaped silicon carbide (SiC) plate is placed at a position several millimeters away from the edge of the wafer 24. Alternatively, a substrate peripheral structure 23 of a silicon carbide ring is placed at a position in contact with the outer periphery of the backside of the wafer 24. The contact situation will be described in more detail with reference to FIGS. 6 and 7.

Figure 4A:
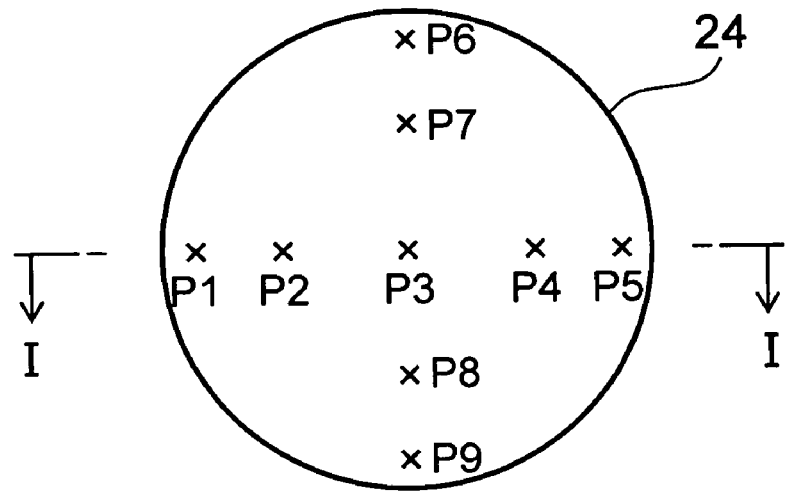
FIG. 4 shows a bottom view (FIG. 4A) and a cross-sectional view (FIG. 4B) of measurement points for measuring the reflectivity of the wafer.
Figure 4B:
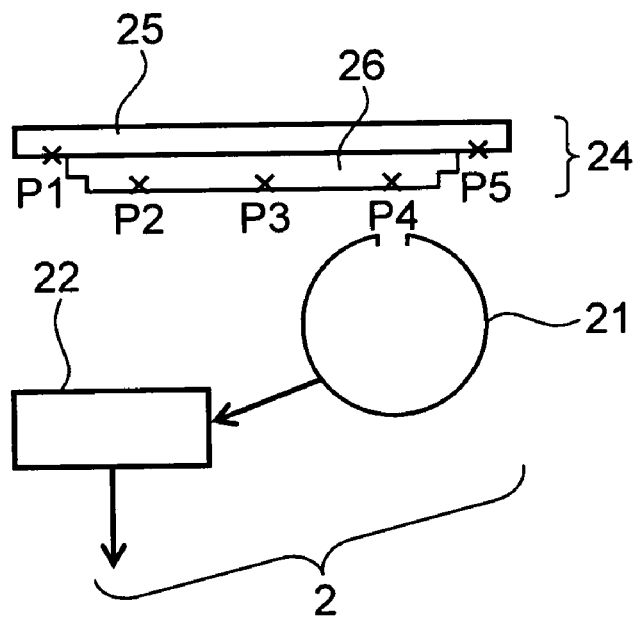

In the second step S1-2, as shown in FIGS. 4A and 4B, the reflectivity (emissivity) measuring apparatus 2 measures reflectivity at a plurality of measurement points P1 to P9 on the backside of the wafer 24. The reflectivity at measurement points P1 to P9 is measured for each wafer 24 before lamp heating. This measurement can be made before transferring the wafer into the heat treatment chamber. The reflectivity (emissivity) measuring apparatus 2 can be the same as the apparatus used in step S-1.

The reflectivity of the backside of the wafer 24 may be nonuniform within the wafer for reasons described below. The first reason is the film growth step for growing films on the backside of the semiconductor substrate 25. As shown in FIG. 4B, the wafer 24 has a backside film 26 provided on the backside of the semiconductor substrate 25. The film growth step in the semiconductor device manufacturing method may include film growth techniques such as chemical vapor deposition (CVD), plasma CVD, and sputtering. In the CVD technique, a backside film 26 having a uniform film thickness is grown across the backside of the semiconductor substrate 25. In the latter two techniques, plasma CVD and sputtering, a backside film 26 is grown on the outer periphery of the backside of the semiconductor substrate 25, but not grown inside the outer periphery of the backside. Thus the backside film 26 grown on the backside of the semiconductor substrate 25 is nonuniform within the wafer 24. As a result, the reflectivity of the backside of the wafer 24 may be nonuniform within the wafer.

The second reason is the processing step in the semiconductor device manufacturing method. The processing step may include anisotropic dry etching, isotropic dry etching, batch wet etching, and single-wafer wet etching. The first technique, anisotropic dry etching, does not etch the backside film 26. The third technique, batch wet etching, uniformly etches the backside film 26. Thus these two techniques are free from within-wafer nonuniformity of reflectivity on the backside of the wafer 24. On the other hand, in the second technique, isotropic dry etching, and the fourth technique, single-wafer wet etching, the outer periphery of the backside film 26 is etched by plasmas or chemicals extending into the outer periphery on the backside of the semiconductor substrate 25. Thus the reflectivity of the backside of the wafer 24 becomes nonuniform within the wafer. Furthermore, the first reason and the second reason may be combined to increase the within-wafer nonuniformity of reflectivity on the backside of the wafer 24.

In step S2 of FIG. 2, the input unit 11 in FIG. 1 inputs the preset temperature or preset temperature profile of the wafer 24 during heat treatment.

In step S3, the storage unit 12 stores the preset temperature or preset temperature profile.

Figure 5A:
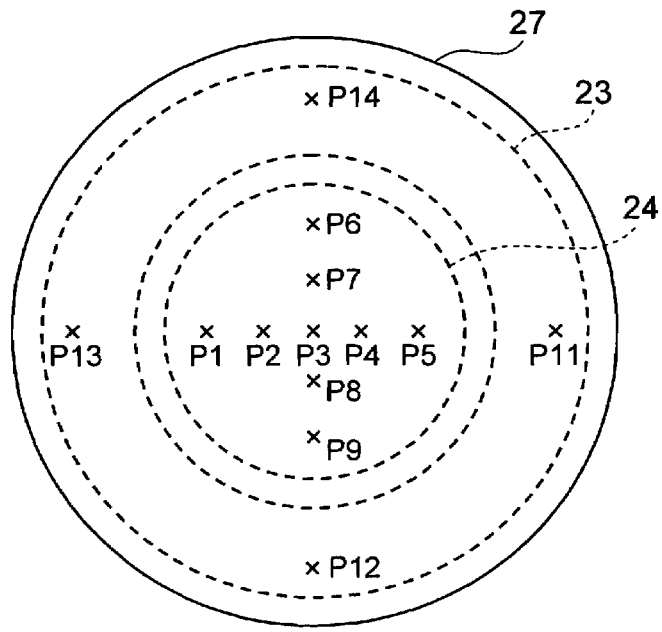
FIG. 5 shows a first reflectivity profile (FIG. 5B) in the uniform heating temperature region (FIG. 5A).
Figure 5B:
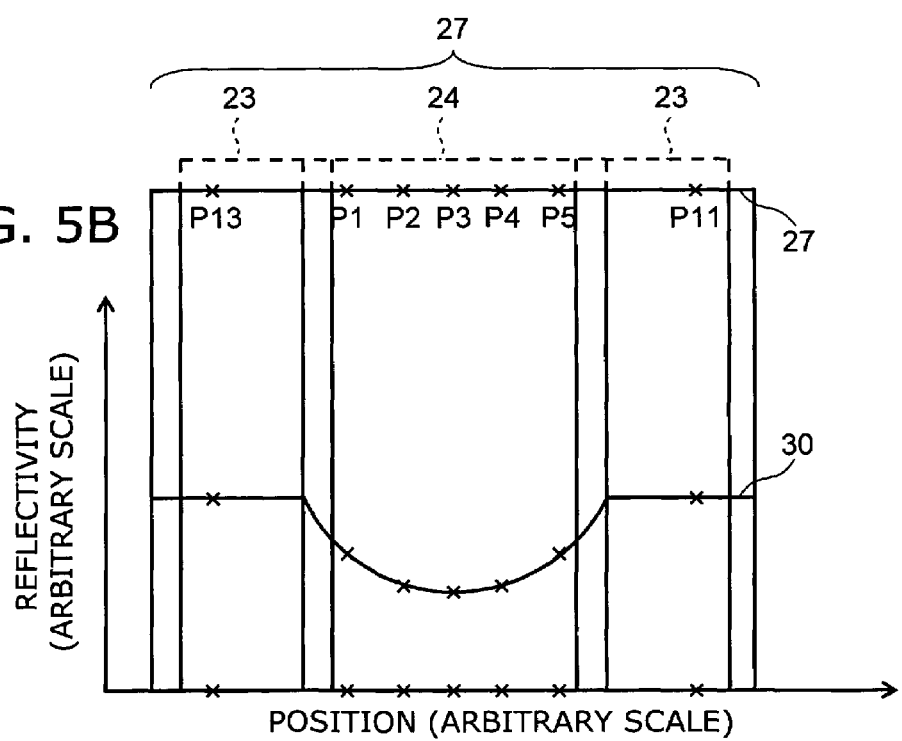

In step S4, the input unit 11 inputs the measured reflectivity at multiple points in the uniform heating temperature region (on the backside of the substrate peripheral structure 23 and the wafer 24). Thus, as shown in FIGS. 5A and 5B, reflectivities at measurement points P1 to P9, P11 to P14 in the uniform heating temperature region 27 are smoothly connected by leveling or other techniques to produce a reflectivity profile 30, which is a within-wafer distribution of reflectivity in the uniform heating temperature region 27.

Figure 6A:
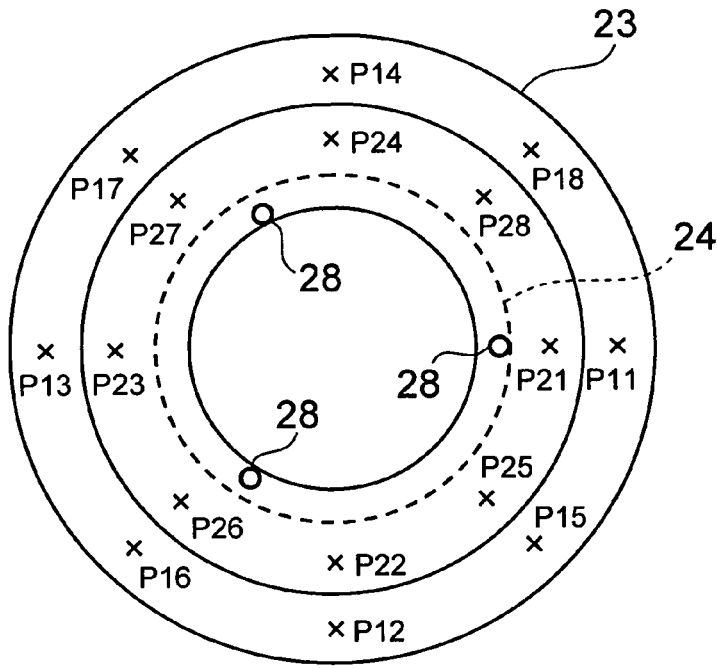
FIG. 6 shows a bottom view (FIG. 6A) and a cross-sectional view (FIG. 6B) of a second set of measurement points for measuring the reflectivity of the substrate peripheral structure.
Figure 6B:
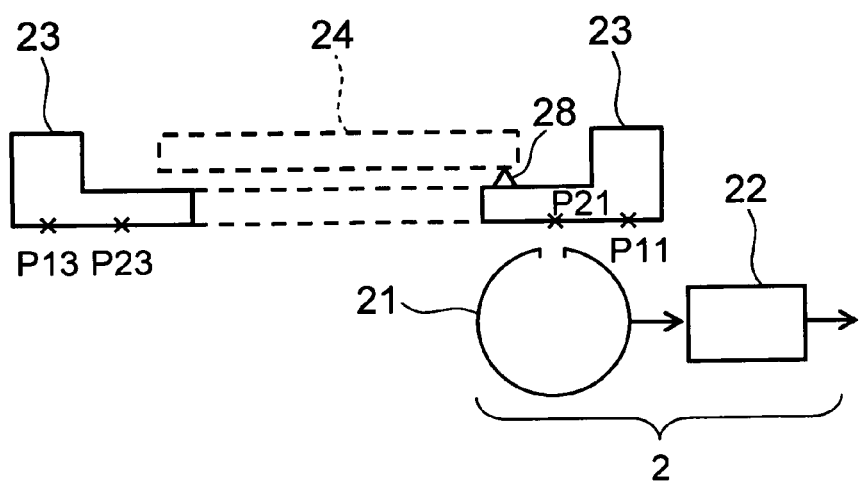
Figure 7A:
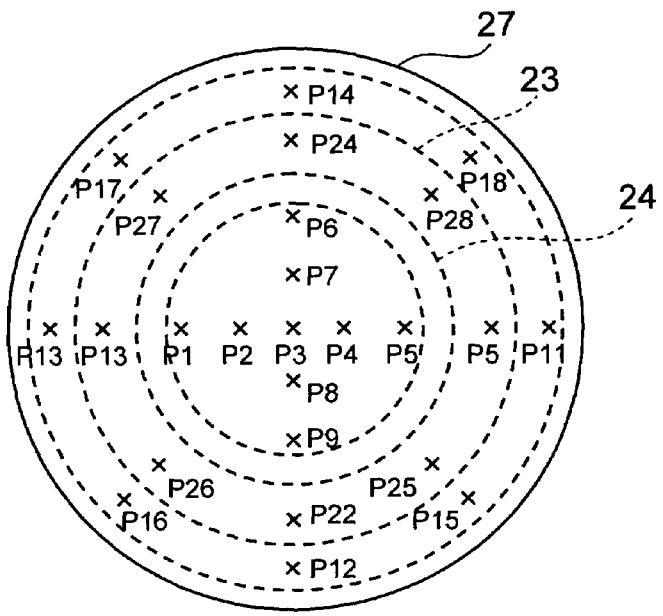
FIG. 7 shows a second reflectivity profile (FIG. 7B) in the uniform heating temperature region (FIG. 7A).
Figure 7B:
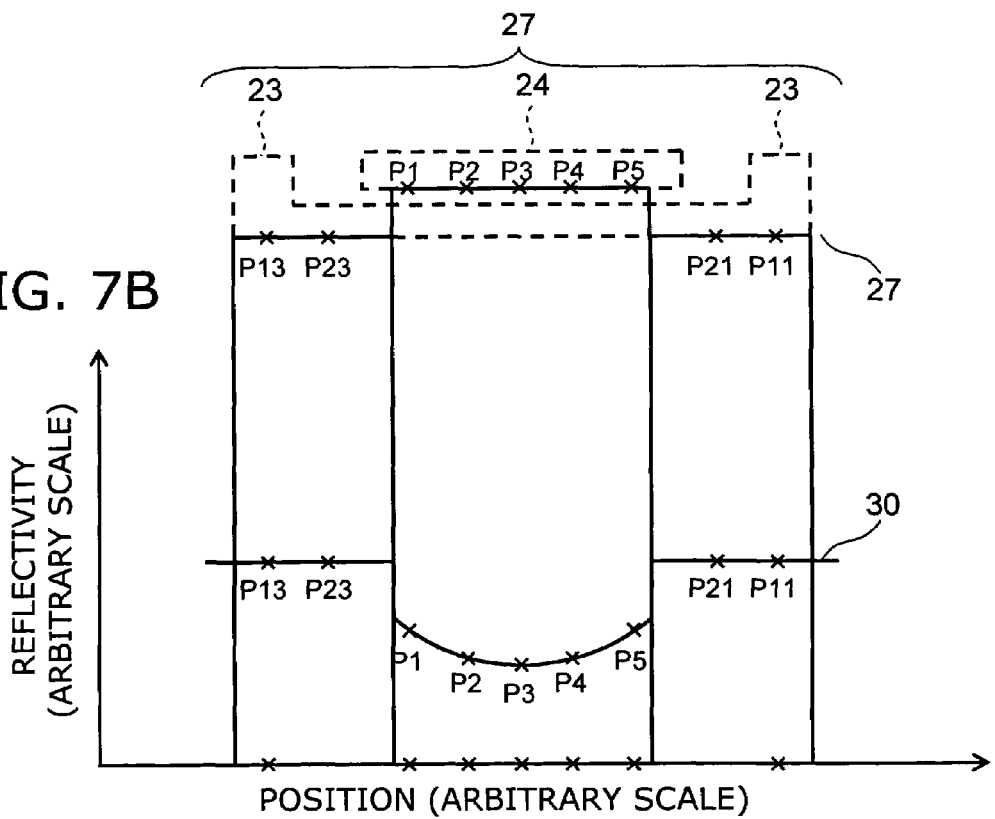

As shown in FIG. 6, the substrate peripheral structure 23 may be a wafer support for supporting the wafer 24. The wafer support 23 is also warmed to the same temperature as the wafer 24 during heat treatment so that the temperature of the wafer 24 during heat treatment is made uniform within the wafer. The wafer support 23 has wafer supporting pins 28, which are in contact with the wafer 24. This is because, when the temperature of the wafer support 23 is lower than that of the wafer 24, heat flows from the wafer 24 to the wafer support 23 via the wafer supporting pins 28 and prevents the temperature within the wafer 24 from achieving uniformity. The wafer 24 and the wafer support or substrate peripheral structure 23 warmed to the same temperature as the wafer 24 constitute a uniform heating temperature region 27. The reflectivity (emissivity) measuring apparatus 2 uses the integral sphere 21 to measure reflectivity at a plurality of measurement points P11 to P18, P21 to P28 on the backside of the wafer support 23. The input unit 11 inputs the reflectivity measured at a plurality of measurement points P1 to P9, P11 to P18, P21 to P28 in the uniform heating temperature region 27 as shown in FIG. 7A. Thus, as shown in FIG. 7B, reflectivities at all the measurement points P1 to P9, P11 to P18, P21 to P28 including P1 to P5, P11, P13, P21, P23 in the uniform heating temperature region 27 are smoothly connected by leveling or other techniques to produce a reflectivity profile 30, which is a within-wafer distribution of reflectivity in the uniform heating temperature region 27.

Next, in step S5 of FIG. 2, the storage unit in FIG. 1 stores the reflectivities at the measurement points P11 to P18, P21 to P28 of the substrate peripheral structure 23.

In step S6, the emissivity (reflectivity) calculation unit 13 uses the reflectivity profile 30 to calculate emissivity at each of single or multiple radiation intensity measurement points where radiation intensity is to be measured in the next step S7. The calculation of emissivity is carried out once for each wafer 24. If, in step S1, emissivity can be measured by the reflectivity (emissivity) measuring apparatus 2, then in step S6, an emissivity profile 30 produced in step S4 is used to calculate reflectivity and produce a reflectivity profile. If the semiconductor substrate 25 is a silicon (Si) substrate, the relation that the sum of reflectivity and emissivity equals unity holds at heat treatment temperatures such as above 400° C. Therefore once one of reflectivity and emissivity is measured, the other can be easily calculated from this relation.

Figure 8:
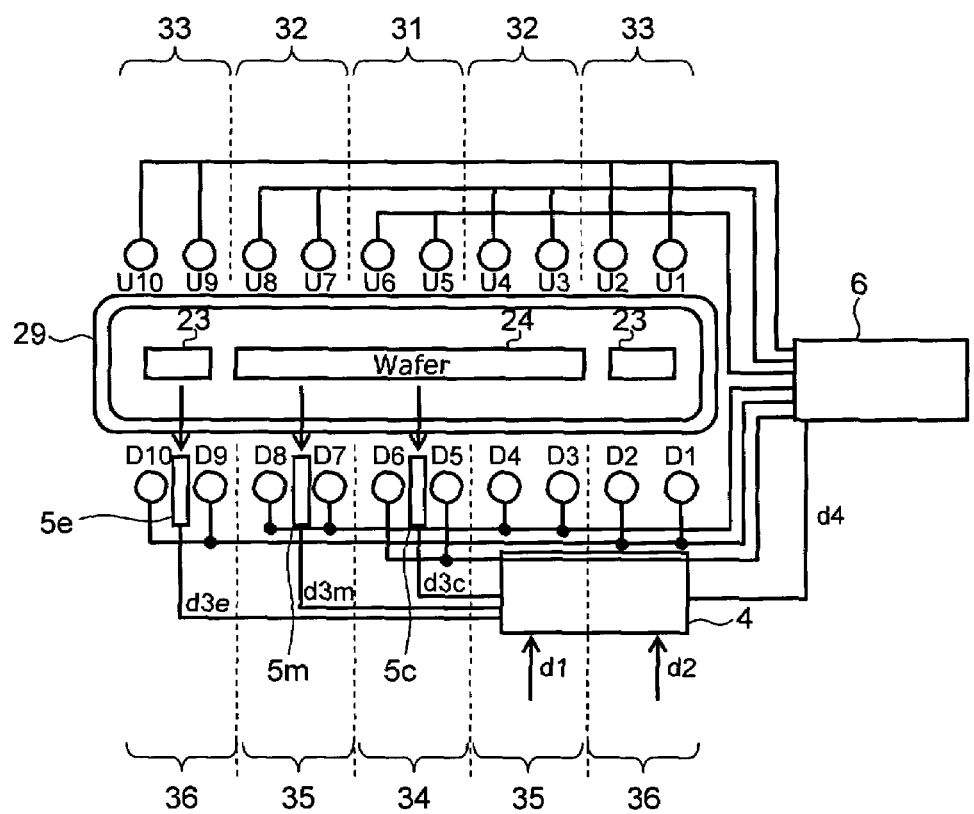
FIG. 8 is a first layout diagram of a semiconductor device manufacturing apparatus according to one embodiment of the invention.
Figure 9:
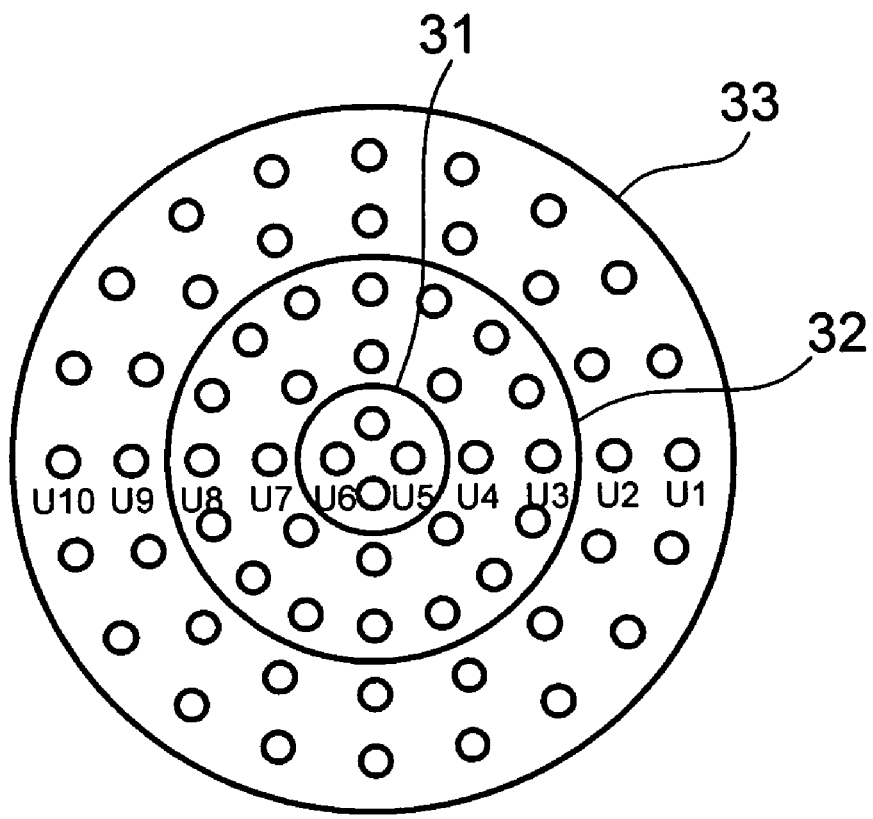
FIG. 9 is a layout diagram of upside halogen lamps in the semiconductor device manufacturing apparatus according to one embodiment of the invention.
Figure 10:
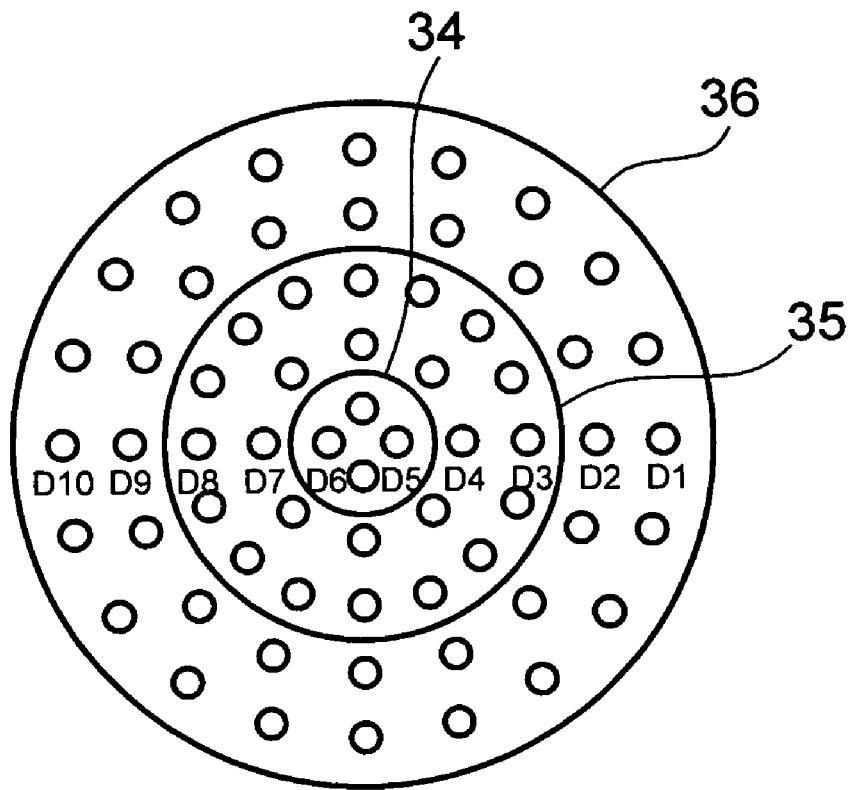
FIG. 10 is a layout diagram of downside halogen lamps in the semiconductor device manufacturing apparatus according to one embodiment of the invention.

In step S7, as shown in FIG. 8, the wafer 24 and the substrate peripheral structure 23 are transferred into the heat treatment chamber 29 of the semiconductor device manufacturing apparatus 3. Upside lamps U1 to U10 are placed above the heat treatment chamber 29 at the frontside of the wafer 24 and the substrate peripheral structure 23. As shown in FIG. 9, the upside lamps U1 to U10 are placed in concentric regions composed of an upside central zone 31, an upside inner peripheral zone 32, and an upside outer peripheral zone 33, and can be supplied with different levels of electric power for respective zones 31 to 33. Naturally, depending on the situation, different levels of electric power may be supplied to each of the upside lamps U1 to U10. On the other hand, as shown in FIG. 8, downside lamps D1 to D10 are placed below the heat treatment chamber 29 at the backside of the wafer 24 and the substrate peripheral structure 23. As shown in FIG. 10, the downside lamps D1 to D10 are placed in concentric regions composed of a downside central zone 34, a downside inner peripheral zone 35, and a downside outer peripheral zone 36, and can be supplied with different levels of electric power for respective zones 34 to 36. Naturally, depending on the situation, different levels of electric power may be supplied to each of the downside lamps D1 to D10. As mentioned earlier, as shown in FIG. 8, the reflectivity d1 at multiple points and the preset temperature d2 have been inputted to the control unit 4. The separation into the upside central zone 31, upside inner peripheral zone 32, and upside outer peripheral zone 33, and into the downside central zone 34, downside inner peripheral zone 35, and downside outer peripheral zone 36, is not limited to the concentric configuration. The reflectivity profile 30 of FIG. 5B or 7B can be referred to for separation into high-reflectivity and low-reflectivity regions based on the magnitude of reflectivity.

The upside lamps U1 to U10 and the downside lamps D1 to D10 emit light, and the wafer 24 and the substrate peripheral structure 23 are irradiated with the lamp light. The wafer 24 and the substrate peripheral structure 23 are thus heated and emit radiation. As shown in FIG. 8, an optical intensity measuring unit 5$c$ is placed in the downside central zone 34. An optical intensity measuring unit 5$m$ is placed in the downside inner peripheral zone 35. An optical intensity measuring unit 5$e$ is placed in the downside outer peripheral zone 36. The optical intensity measuring units 5$c$, 5$m$, and 5$e$ measure radiation intensities d3$c$, d3$m$, and d3$e$ at multiple radiation intensity measurement points on the backside of the wafer 24 and the substrate peripheral structure 23.

Figure 11:
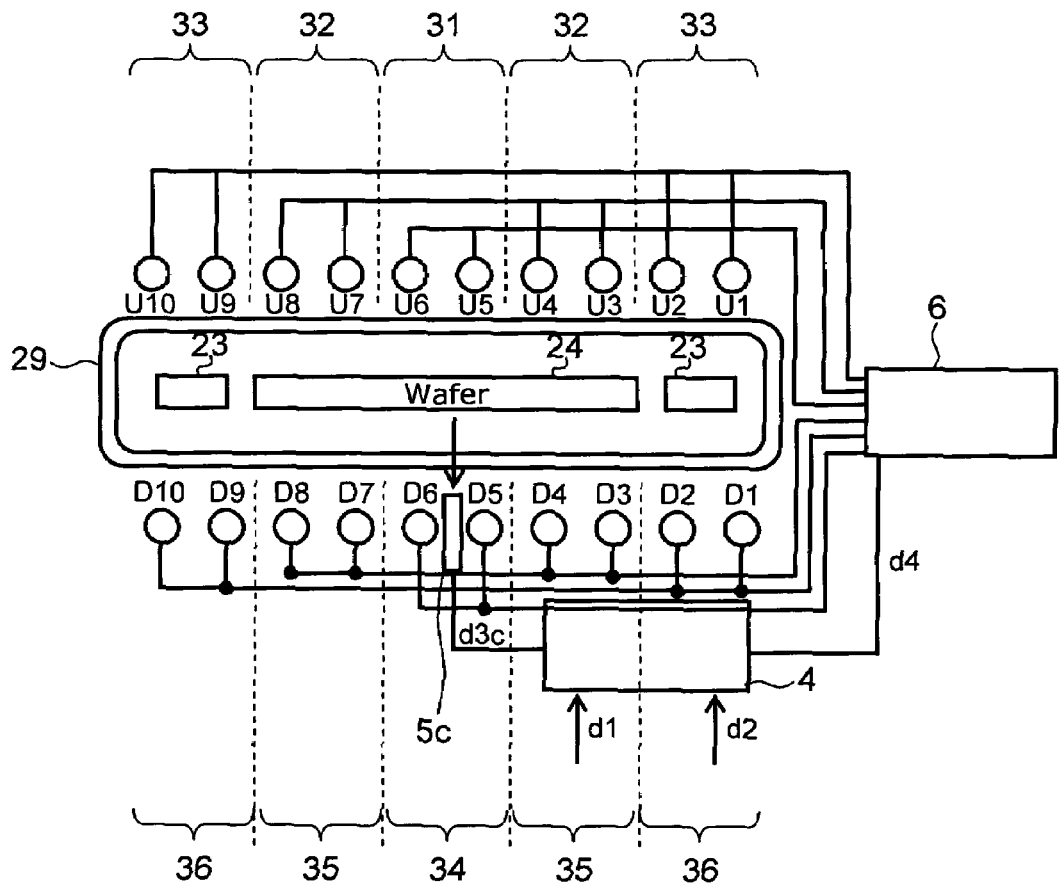
FIG. 11 is a second layout diagram of a semiconductor device manufacturing apparatus according to one embodiment of the invention.

Note that, as shown in FIG. 11, the optical intensity measuring unit 5 may be a single optical intensity measuring unit 5$c$. The radiation intensity d3$c$ at a single radiation intensity measurement point can be used to calculate temperature at a single radiation intensity measurement point.

Figure 12:
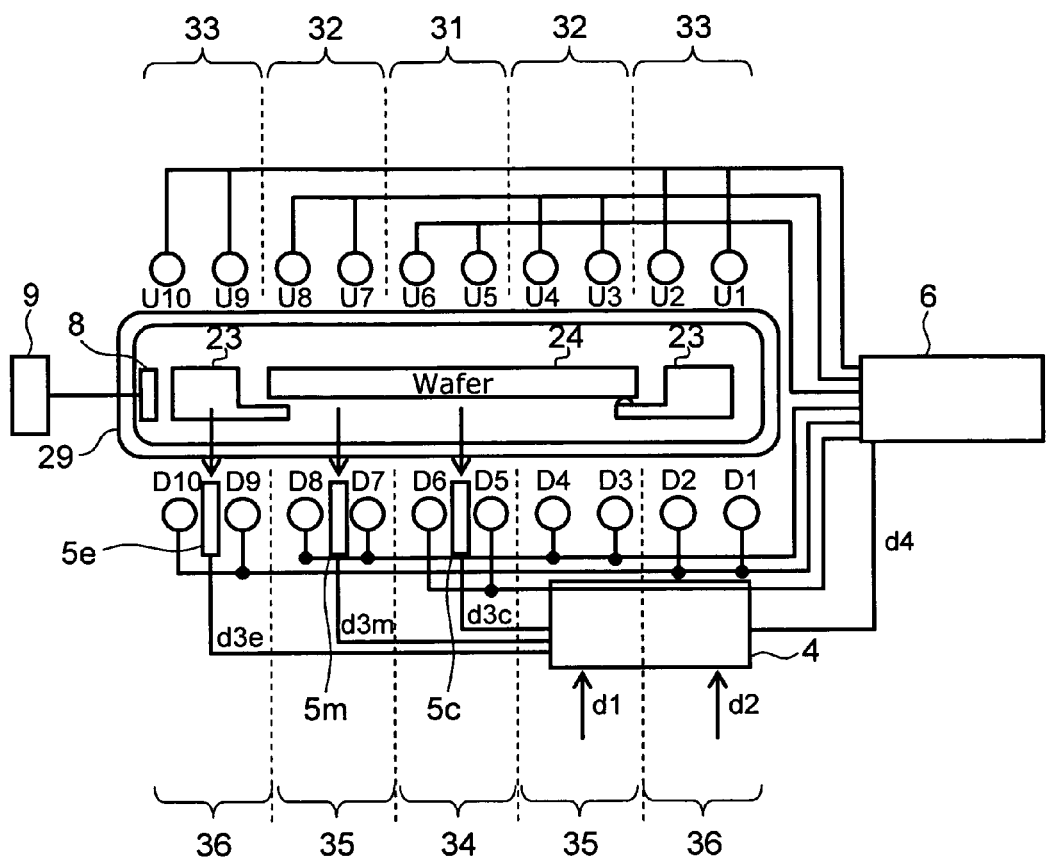
FIG. 12 is a third layout diagram of a semiconductor device manufacturing apparatus according to one embodiment of the invention.
Figure 13:
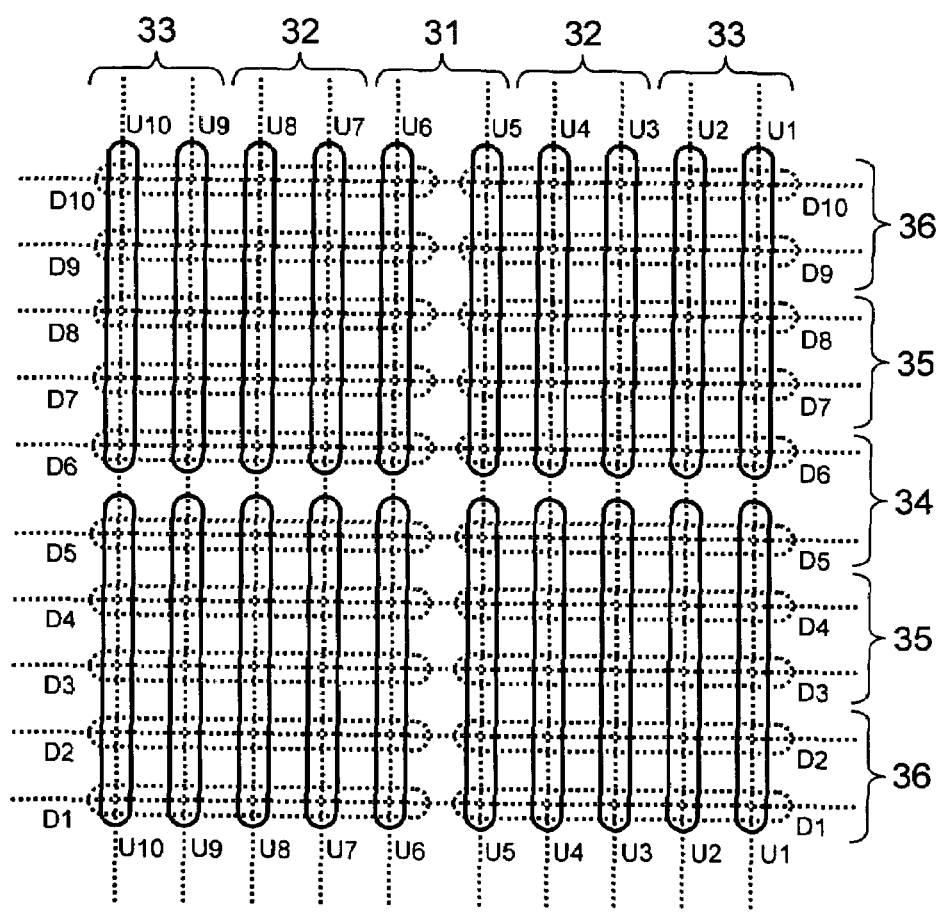
FIG. 13 is a layout diagram of upside and downside halogen lamps in the semiconductor device manufacturing apparatus according to one embodiment of the invention.

Furthermore, as shown in FIGS. 12 and 13, the upside lamps U1 to U10 and the downside lamps D1 to D10 may be linear light sources instead of the point light sources in FIGS. 9 and 10. Linear light sources of the upside lamps U1 to U10 are arranged in the vertical direction, and linear light sources of the downside lamps D1 to D10 are arranged in the horizontal direction, orthogonal to the vertical direction. When the upside lamps U1 to U10 and the downside lamps D1 to D10 are linear light sources, the semiconductor device manufacturing apparatus 3 further includes a rotation unit 8 and a rotation control unit 9. The rotation unit 8 and the rotation control unit 9 can be used to rotate the wafer 24 and the substrate peripheral structure 23 around a rotation axis, which is the line passing through the center of the wafer 24 and being perpendicular to the backside of the wafer 24. This allows the optical intensity of light, which irradiates the wafer 24 and the substrate peripheral structure 23 by the upside lamps U1 to U10 and the downside lamps D1 to D10, to be varied in the radial direction of the wafer 24.

In step S8 of FIG. 2, the input unit 11 in FIG. 1 inputs the radiation intensities d3$c$, d3$m$, and d3$e$ at multiple points on the backside of the wafer 24 and the substrate peripheral structure 23 from the optical intensity measuring units 5$c$, 5$m$, and 5$e$.

In step S9, the rotation unit 8 and the rotation control unit 9 may rotate the wafer 24 and the substrate peripheral structure 23. In order to improve the temperature distribution of the wafer 24, rotation may be carried out not only when the upside lamps U1 to U10 and the downside lamps D1 to D10 are linear light sources but also when they are point light sources.

In step S10, the temperature calculation unit 14 uses the calculated emissivity or emissivity profile and the measured radiation intensities d3$c$, d3$m$, and d3$e$ to calculate backside temperature at each of single or multiple radiation intensity measurement points. Alternatively, the temperature calculation unit 14 uses the calculated emissivity profile and the measured radiation intensities d3$c$, d3$m$, and d3$e$ to calculate backside temperature at each irradiation point of the downside lamps D1 to D10 and a backside temperature profile.

In step S11, the on-substrate optical intensity calculation unit 15 calculates the target value of on-substrate optical intensity at single or multiple radiation intensity measurement points so that the temperature at each of single or multiple radiation intensity measurement points becomes the uniform preset temperature.

In step S12, the optical intensity correction unit 16 corrects the target value of on-substrate optical intensity at multiple radiation intensity measurement points or at on-substrate irradiation points of the lamps so that the light incident on the uniform heating temperature region 27 becomes uniform even when reflectivity is varied or fluctuated in the uniform heating temperature region 27.

In step S13, the lamp optical intensity calculation unit 17 calculates the target value of lamp optical intensity for lamp emission so that the target value of the corrected on-substrate optical intensity is achieved.

Figure 14A:
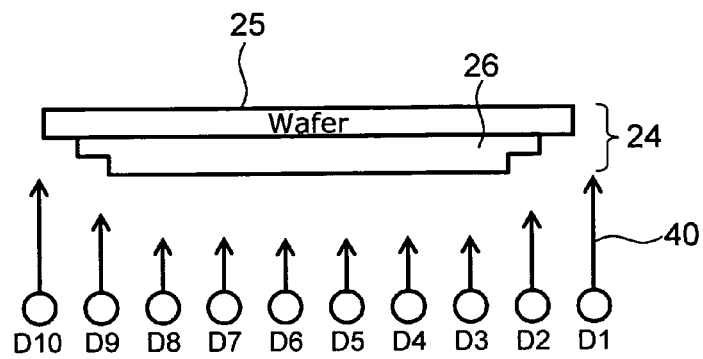
FIG. 14 shows an intensity distribution diagram for radiation from the downside halogen lamps (FIG. 14A) and a backside temperature profile, an emissivity profile, a reflectivity profile, and a lamp power profile (FIG. 14B), for the semiconductor device manufacturing apparatus according to one embodiment of the invention.
Figure 14B:
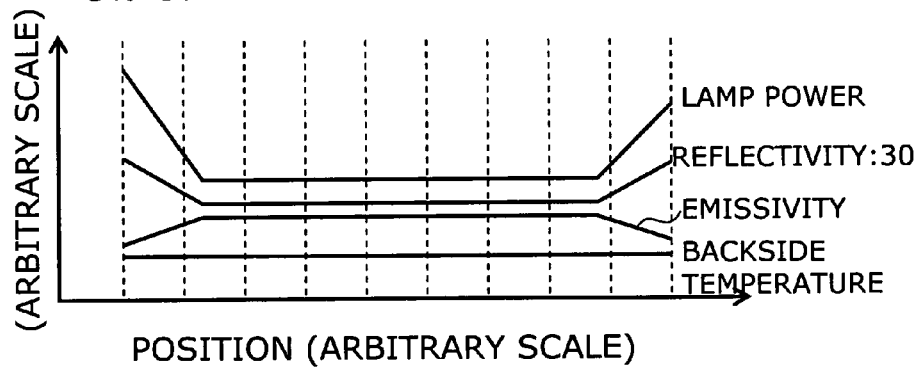

In step S14, the power calculation unit 18 calculates the lamp power value (d4 in FIG. 8 etc.), or a profile of the lamp power value, as shown in FIG. 14B, for each of the downside lamps D1 to D10 so that the target value of lamp optical intensity is achieved.

In step S15, the output unit 19 outputs the lamp power value d4 to the power supply unit 6.

In step S16, the power supply unit 6 supplies each of the downside lamps D1 to D10 with lamp power corresponding to the lamp power value d4.

In step S17, the downside lamps D1 to D10 receive lamp power and emit radiation 40 as shown in FIG. 14A. In the wafer 24, the thickness of the backside film 26 is uniform at the center but decreased in the outer periphery with the distance from the center. Thus, as shown in FIG. 14B, the emissivity in the outer periphery of the backside of the wafer 24 is lower than at the center, the reflectivity in the outer periphery of the backside of the wafer 24 is higher than at the center, and hence the temperature in the outer periphery is likely to be lower than at the center. In response, lamp power supplied to the halogen lamps D1, D2, D9, and D10 irradiating the positions corresponding to the outer periphery of the wafer 24 is increased, and hence the optical intensity is also increased. In this way, depending on the nonuniform optical characteristics of reflectivity and emissivity of the wafer 24, the lamp heating condition can be optimally changed to prevent temperature nonuniformity and achieve a uniform temperature within the wafer 24. Thus the yield reduction due to within-wafer nonuniformity of the semiconductor device characteristics can be prevented.

As described above, in the first example, the reflectivity of the backside of the wafer 24 is measured at multiple points before the wafer 24 is transferred into the heat treatment chamber 29. This allows heating at a temperature that is uniform within the wafer. Note that while the integral sphere 21 is used in the first example, other techniques may be used to measure reflectivity. The wafer 24 transferred to the integral sphere 21, upon the measurement of reflectivity, is moved to another position, and the reflectivity at the new position is measured. While the measurement of reflectivity is carried out at a plurality of points on the diameter of the wafer 24 in this example, the measurement can be carried out similarly at a plurality of points arranged in a lattice or concentric pattern.

After the wafer 24 is transferred into the heat treatment chamber 29, the reflectivity data at a plurality of points within the wafer measured before transfer into the heat treatment chamber is used to calculate the target value of lamp power. That is, radiation intensity from the backside of the wafer 24 during heat treatment is combined with the reflectivity data at a plurality of points within the wafer measured before transfer into the heat treatment chamber to produce temperature data on the backside of the wafer 24. The data is then fed back to the lamps as a distribution of electric power or profile of lamp power supplied to the lamps such as halogen lamps. Besides halogen lamps, the lamps may be xenon (Xe) flash lamps. Alternatively, lamps can be considered as a heat source. Then lasers and infrared heaters can be used as a heat source instead of lamps.

SECOND EXAMPLE

Figures 15A, 15B:
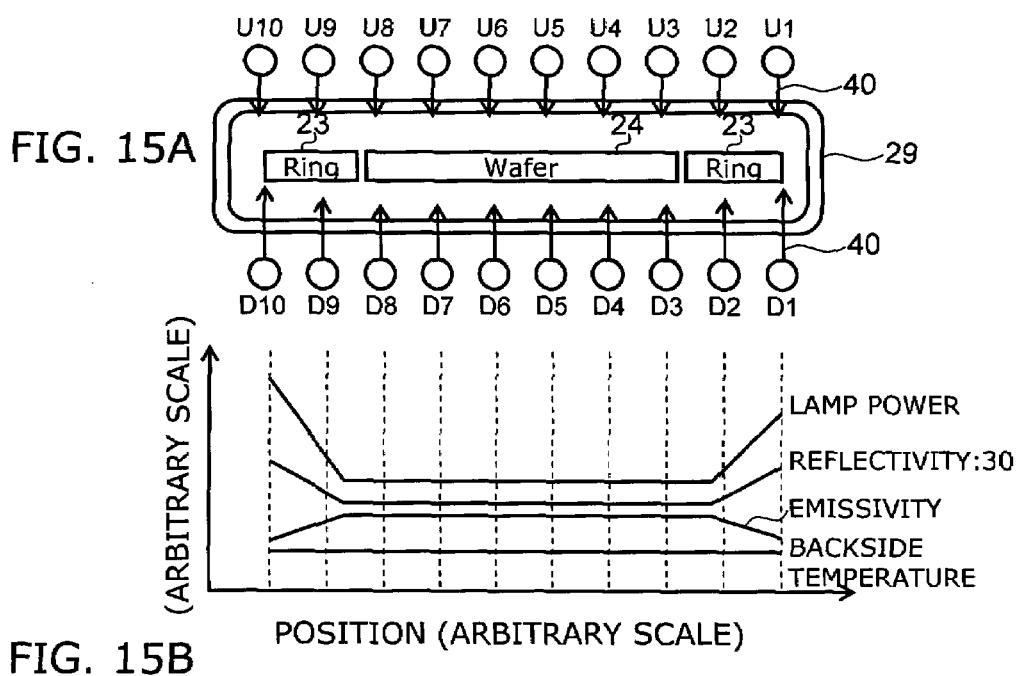
FIG. 15 shows an intensity distribution diagram for radiation from the upside and downside halogen lamps (FIG. 15A) and a backside temperature profile, an emissivity profile, a reflectivity profile, and a lamp power profile of the downside halogen lamps (FIG. 15B), for the semiconductor device manufacturing apparatus according to one embodiment of the invention.

As shown in FIG. 15A, the second example refers to a case where a substrate peripheral structure 23 is placed around the wafer 24 during heat treatment of the wafer 24. The semiconductor device manufacturing system and the semiconductor device manufacturing method used in the second example are the same as those in the first example. For the purpose of preventing temperature decrease on the outer periphery of the wafer 24, a ring of silicon carbide plate is used around the wafer 24 as the substrate peripheral structure 23. In order to control electric power supplied to halogen lamps U1 to U10, D1 to D10 during heat treatment of the wafer 24, temperature control is based not only on emissivity and reflectivity at a single point on the backside of the wafer 24, but also on the emissivity and reflectivity of the substrate peripheral structure 23 as shown in FIG. 15B. Lamp power to halogen lamps irradiating the substrate peripheral structure 23 is adjusted depending on the difference in emissivity and reflectivity between the wafer 24 and the substrate peripheral structure 23. The figure shows a case where the emissivity is higher on the wafer 24 than on the substrate peripheral structure 23. Thus the reflectivity is lower on the wafer 24 than on the substrate peripheral structure 23, and hence the temperature of the substrate peripheral structure 23 is likely to be lower than that of the wafer 24. In response, lamp power supplied to the downside lamps D1, D2, D9, and D10 irradiating the substrate peripheral structure 23 is increased, and hence the optical intensity of radiation 40 irradiating the substrate peripheral structure 23 as shown in FIG. 15A is also increased. In this way, depending on the nonuniform optical characteristics of reflectivity and emissivity in the uniform heating temperature region 27 composed of the wafer 24 and the substrate peripheral structure 23, the lamp heating condition can be optimally changed to achieve a uniform temperature in the uniform heating temperature region 27, thereby preventing temperature nonuniformity and achieving a uniform temperature within the wafer 24. Thus the yield reduction due to within-wafer nonuniformity of the semiconductor device characteristics can be prevented. Note that the upside lamps U1 to U10 can emit radiation 40 with an arbitrary optical intensity. For example, as shown in FIG. 15A, the radiation 40 from the upside lamps U1 to U10 may have an equal optical intensity.

THIRD EXAMPLE

Figure 16A:
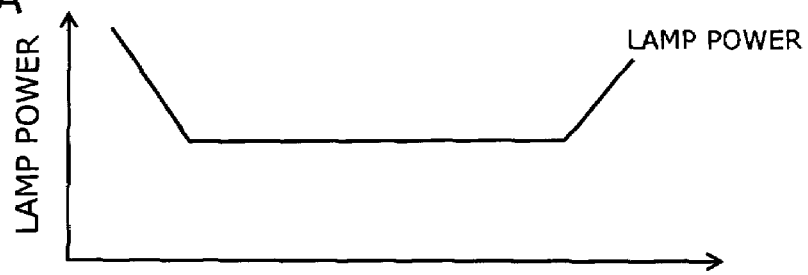
FIG. 16 shows a lamp power profile of the upside halogen lamps (FIG. 16A), an intensity distribution diagram for radiation from the upside and downside halogen lamps (FIG. 16B), and a backside temperature profile, an emissivity profile, and a reflectivity profile (FIG. 16C), for the semiconductor device manufacturing apparatus according to one embodiment of the invention.

As shown in FIG. 16A, the third example also refers to a case where a substrate peripheral structure 23 is placed around the wafer 24 during heat treatment of the wafer 24. The semiconductor device manufacturing system and the semiconductor device manufacturing method used in the third example are the same as those in the first example. For the purpose of preventing temperature decrease on the outer periphery of the wafer 24, a ring of silicon carbide plate is used around the wafer 24 as the substrate peripheral structure 23. In the third example, linear light sources are used for the upside halogen lamps U1 to U10 and the downside halogen lamps D1 to D10. During heat treatment of the wafer 24, not only electric power supplied to the downside halogen lamps D1 to D10 is controlled, but also electric power supplied to the upside halogen lamps U1 to U10.

Figure 16B:
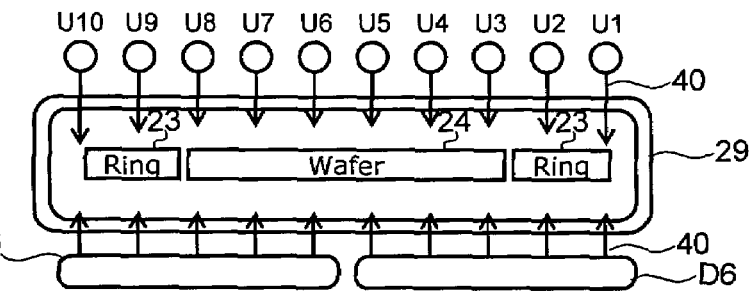
Figure 16C:
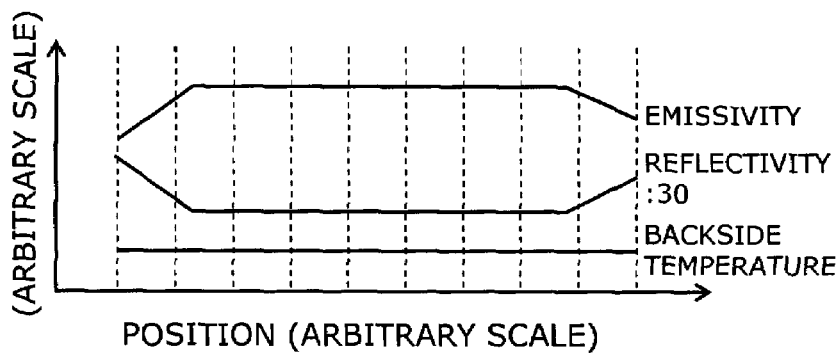

In order to control electric power supplied to halogen lamps U1 to U10, D1 to D10 during heat treatment of the wafer 24, temperature control is based not only on emissivity and reflectivity at a single point on the backside of the wafer 24, but also on the emissivity and reflectivity of the substrate peripheral structure 23 as shown in FIG. 16C. Lamp power to halogen lamps U1 to U10, D1 to D10 irradiating the substrate peripheral structure 23 is adjusted depending on the difference in emissivity and reflectivity between the wafer 24 and the substrate peripheral structure 23. Because the wafer 24 and the substrate peripheral structure 23 are rotated, this rotation should be taken into consideration to select appropriate halogen lamps U1 to U10, D1 to D10 for adjusting lamp power. As with the second example, the figure shows a case where the emissivity is higher on the wafer 24 than on the substrate peripheral structure 23. Thus the reflectivity is lower on the wafer 24 than on the substrate peripheral structure 23, and hence the temperature of the substrate peripheral structure 23 is likely to be lower than that of the wafer 24. In response, as shown in FIG. 16A, lamp power supplied to the halogen lamps U1, U2, U9, U10, D1, D2, D9, and D10 irradiating the substrate peripheral structure 23 is increased, and hence the optical intensity of radiation 40 irradiating the substrate peripheral structure 23 as shown in FIG. 16B is also increased. In this way, depending on the nonuniform optical characteristics of reflectivity and emissivity in the uniform heating temperature region 27 composed of the wafer 24 and the substrate peripheral structure 23, the lamp heating condition can be optimally changed to achieve a uniform temperature in the uniform heating temperature region 27, thereby preventing temperature nonuniformity and achieving a uniform temperature within the wafer 24. Thus the yield reduction due to within-wafer nonuniformity of the semiconductor device characteristics can be prevented.

FOURTH EXAMPLE

As shown in FIG. 17B, like the first example of FIG. 14A, the fourth example also refers to a case where the wafer 24 includes a semiconductor substrate 25 and a backside film 26 provided on the backside of the semiconductor substrate 25. The semiconductor device manufacturing system and the semiconductor device manufacturing method used in the fourth example are the same as those in the first example. The thickness of the backside film 26 is uniform at the center but decreased in the outer periphery with the distance from the center. Thus, as shown in FIG. 17C, the emissivity in the outer periphery of the backside of the wafer 24 is lower than at the center, the reflectivity in the outer periphery of the backside of the wafer 24 is higher than at the center, and hence the temperature in the outer periphery is likely to be lower than at the center. In response, the lamp power profile 41 of the downside halogen lamps D1 to D10 before adjustment is changed to the lamp power profile 43 of the downside halogen lamps D1 to D10 after the downside adjustment so that lamp power supplied to the downside halogen lamps D1, D2, D9, and D10 irradiating the positions corresponding to the outer periphery of the wafer 24 is increased. Thus the optical intensity of radiation 40 from the downside halogen lamps D1, D2, D9, and D10 is increased. In this way, depending on the nonuniform optical characteristics of reflectivity and emissivity of the wafer 24, the lamp heating condition of the downside halogen lamps D1 to D10 can be optimally changed to prevent temperature nonuniformity and achieve a uniform temperature within the wafer 24. Thus the yield reduction due to within-wafer nonuniformity of the semiconductor device characteristics can be prevented.

Furthermore, as shown in FIG. 17C, while maintaining within-wafer uniformity of the backside temperature of the wafer 24, the increased lamp power supplied to the downside halogen lamps D1, D2, D9, and D10 irradiating the positions corresponding to the backside of the outer periphery of the wafer 24 is decreased within the range of the increased amount, and lamp power supplied to the upside halogen lamps U1, U2, U9, and U10 irradiating the positions corresponding to the frontside of the outer periphery of the wafer 24 is increased within the range of the increased amount for the downside halogen lamps D1, D2, D9, and D10. Specifically, as shown in FIG. 17C, the lamp power profile 43 of the downside halogen lamps D1 to D10 after the downside adjustment is changed to the lamp power profile 42 of the downside halogen lamps D1 to D10 after the dual-side adjustment. Moreover, as shown in FIG. 17A, the lamp power profile 44 of the upside halogen lamps U1 to U10 before adjustment and after the downside adjustment is changed to the lamp power profile 45 of the upside halogen lamps U1 to U10 after the dual-side adjustment. Thus the maximum lamp power can be reduced, and hence the lamp lifetime can be extended.

The first to fourth examples are only intended for specific embodiments for carrying out the invention and not to be construed as limiting the scope of the invention. The invention can be carried out in various ways without departing from the spirit or principal features thereof. That is, various modifications, improvements, and/or partial applications to other purposes can be made without departing from the scope of the claims herein, and they are all encompassed within the claims herein.

The invention claimed is:

1. A method of manufacturing a semiconductor device by processing a wafer, comprising:
   measuring a reflectivity of a substrate peripheral structure before heating, the substrate peripheral structure being placed close to the wafer and being heated simultaneously with the wafer by a plurality of heat sources;
   measuring a wafer reflectivity of the wafer before the heating;
   calculating a wafer emissivity of the wafer from the wafer reflectivity;
   measuring a wafer radiation intensity of radiation emitted from the wafer during the heating;
   calculating a wafer temperature of the wafer from the wafer emissivity and the wafer radiation intensity;
   calculating a target value of on-wafer optical intensity on the wafer so that the wafer temperature becomes a preset temperature;
   calculating a target value of optical intensity on the substrate peripheral structure from a difference between the reflectivity of the substrate peripheral structure and the wafer reflectivity so that incident light being incident on the substrate peripheral structure and wafer incident light being incident on the wafer have an equal optical intensity;
   calculating target values of heat source optical intensity for heating by the heat sources so that the target value of on-wafer optical intensity and the target value of optical intensity of the substrate peripheral structure are achieved;
   calculating target values of heat source power so that the target values of heat source optical intensity are achieved; and
   inputting the target values of heat source power to the plurality of heat sources and causing the heat sources to emit light.

2. A method of manufacturing a semiconductor device according to claim 1, further comprising:
   calculating an emissivity of the substrate peripheral structure from the reflectivity of the substrate peripheral structure;
   measuring a radiation intensity of radiation emitted from the substrate peripheral structure during the heating;
   calculating a temperature of the substrate peripheral structure from the emissivity of the substrate peripheral structure and the radiation intensity of radiation emitted from the substrate peripheral structure; and
   correcting the target value of the optical intensity of the substrate peripheral structure so that the temperature of the substrate peripheral structure becomes the preset temperature.

3. A method of manufacturing a semiconductor device according to claim 1, wherein the substrate peripheral structure supports the wafer.

4. A method of manufacturing a semiconductor device according to claim 1, wherein the wafer has a semiconductor substrate and a backside film provided on a backside of the semiconductor substrate.

5. A method of manufacturing a semiconductor device according to claim 4, wherein a thickness of the backside film is nonuniform.

6. A method of manufacturing a semiconductor device according to claim 1, wherein the heat sources are point light sources.

7. A method of manufacturing a semiconductor device according to claim 1, wherein the heat sources are linear light sources.

8. A method of manufacturing a semiconductor device according to claim 1, wherein the wafer and the substrate peripheral structure are heated while being rotated around a rotation axis, which is a line passing through a center of the wafer and being perpendicular to a major surface of the wafer.

9. A method of manufacturing a semiconductor device by processing a wafer, the wafer being simultaneously heated by a plurality of upside heat sources placed at a frontside of the wafer and by a plurality of downside heat sources placed at a backside of the wafer, the method comprising:
   measuring a central reflectivity of a central portion of the backside of the wafer and a reflectivity of an outer peripheral portion of the backside before the heating;
   calculating a central emissivity of the wafer from the central reflectivity;
   measuring a central radiation intensity of radiation emitted from the central portion during the heating;
   calculating a central temperature of the central portion from the central emissivity and the central radiation intensity;
   calculating a target value of central optical intensity on the central portion so that the central temperature becomes a preset temperature;
   calculating a target value of optical intensity on the outer peripheral portion from a difference between the reflectivity of the outer peripheral portion and the central reflectivity so that incident light being incident on the outer peripheral portion and central incident light being incident on the central portion have an equal optical intensity;

calculating a plurality of target values of downside heat source optical intensity for heating by the plurality of downside heat sources, respectively, so that the target value of central optical intensity and the target value of outer peripheral optical intensity are achieved;

calculating a plurality of target values of upside heat source optical intensity for heating by the plurality of upside heat sources, respectively, so that the plurality of target values of downside heat source optical intensity have a smaller difference;

calculating target values of downside heat source power so that the target values of downside heat source optical intensity are achieved;

calculating target values of upside heat source power so that the target values of upside heat source optical intensity are achieved;

inputting the target values of downside heat source power to the plurality of downside heat sources and causing the downside heat sources to emit light; and inputting the target values of upside heat source power to the plurality of upside heat sources and causing the upside heat sources to emit light.

10. A method of manufacturing a semiconductor device according to claim 9, further comprising:

calculating an emissivity of the outer peripheral portion from the reflectivity of the outer peripheral portion;

measuring a radiation intensity of radiation emitted from the outer peripheral portion during the heating;

calculating a temperature of the outer peripheral portion from the emissivity of the outer peripheral portion and the radiation intensity of the outer peripheral portion; and correcting the target value of the optical intensity of the outer peripheral portion so that the temperature of the outer peripheral portion becomes the preset temperature.

11. A method of manufacturing a semiconductor device according to claim 9, wherein the wafer has a semiconductor substrate and a backside film provided on a backside of the semiconductor substrate.

12. A method of manufacturing a semiconductor device according to claim 11, wherein a thickness of the backside film is nonuniform.

13. A method of manufacturing a semiconductor device according to claim 9, wherein the heat sources are point light sources.

14. A method of manufacturing a semiconductor device according to claim 9, wherein the wafer and the substrate peripheral structure are heated while being rotated around a rotation axis, which is a line passing through a center of the wafer and being perpendicular to a major surface of the wafer.

15. An apparatus for manufacturing a semiconductor device comprising:

a plurality of heat sources which emit light with an inputted heat source power and heating a uniform heating temperature region including a wafer;

an input unit which inputs reflectivity at a plurality of positions in the uniform heating temperature region, the reflectivity being measured before the heating;

an emissivity calculation unit which calculates emissivity of the uniform heating temperature region from the reflectivity;

an optical intensity measuring unit which measures radiation intensity of radiation emitted from the uniform heating temperature region during the heating;

a temperature calculation unit which calculates a heating temperature of the uniform heating temperature region from the emissivity and the radiation intensity;

an optical intensity calculation unit which calculates a target value of on-region optical intensity on the uniform heating temperature region so that the heating temperature becomes a preset temperature;

a correction unit which corrects the target value of on-region optical intensity using a difference in reflectivity among the plurality of positions so that incident light being incident on the uniform heating temperature region has a uniform optical intensity;

an optical intensity calculation unit which calculates a target value of optical intensity for heating by the plurality of heat sources so that the target value of on-region optical intensity is achieved;

a power calculation unit which calculates a target value of heat source power so that the target value of heat source optical intensity is achieved; and a power supply unit which supplies heat source power at the target value of heat source power to the lamps.

16. An apparatus for manufacturing a semiconductor device according to claim 15, wherein the uniform heating temperature region includes the wafer and a substrate peripheral structure provided close to the wafer, the input unit inputs a reflectivity of the substrate peripheral structure, the emissivity calculation unit calculates emissivity of the substrate peripheral structure from the reflectivity of the substrate peripheral structure, the optical intensity measuring unit measures radiation intensity of radiation emitted from the substrate peripheral structure during the heating, and the temperature calculation unit calculates a heating temperature of the substrate peripheral structure from the emissivity of the substrate peripheral structure and the radiation intensity of the substrate peripheral structure.

17. An apparatus for manufacturing a semiconductor device according to claim 15, wherein the plurality of heat sources include a plurality of upside heat sources placed at a frontside of the wafer and a plurality of downside heat sources placed at a backside of the wafer.

18. An apparatus for manufacturing a semiconductor device according to claim 17, wherein the correction unit corrects the target value so that target values of downside heat source optical intensity have a smaller difference.

19. An apparatus for manufacturing a semiconductor device according to claim 17, wherein the heat sources are point light sources.

20. An apparatus for manufacturing a semiconductor device according to claim 17, wherein the heat sources are linear light sources.

* * * * *